US010637445B2

United States Patent
Taori et al.

(10) Patent No.: US 10,637,445 B2
(45) Date of Patent: Apr. 28, 2020

(54) SIGNALING METHODS FOR COMMUNICATION SYSTEMS WITH WIDELY SPACED DOWNLINK AND UPLINK FREQUENCY CHANNELS

(71) Applicant: Phazr, Inc., Allen, TX (US)

(72) Inventors: Rakesh Taori, McKinney, TX (US); Farooq Khan, Allen, TX (US); Robert Clark Daniels, Round Rock, TX (US); Shadi Abu-Surra, Plano, TX (US); Sudhir Ramakrishna, Plano, TX (US)

(73) Assignee: Phazr, Inc., Allen, TX (US)

( * ) Notice: Subject to any disclaimer, the term of this patent is extended or adjusted under 35 U.S.C. 154(b) by 0 days.

(21) Appl. No.: 15/898,196

(22) Filed: Feb. 15, 2018

(65) Prior Publication Data

US 2019/0115902 A1    Apr. 18, 2019

Related U.S. Application Data

(60) Provisional application No. 62/574,164, filed on Oct. 18, 2017.

(51) Int. Cl.
| | |
|---|---|
| *H04L 5/00* | (2006.01) |
| *H04W 16/14* | (2009.01) |
| *H04W 16/10* | (2009.01) |
| *H03J 7/06* | (2006.01) |
| *H04W 72/04* | (2009.01) |
| *H04L 5/06* | (2006.01) |
| *H04B 1/00* | (2006.01) |

(52) U.S. Cl.
CPC .............. *H03J 7/065* (2013.01); *H04L 5/003* (2013.01); *H04L 5/06* (2013.01); *H04W 16/10* (2013.01); *H04W 16/14* (2013.01); *H04W 72/0453* (2013.01); *H04B 1/0053* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,477,552 | B2 * | 11/2019 | Chen | H04W 4/20 |
| 10,575,182 | B2 * | 2/2020 | Taori | H04W 16/10 |
| 2003/0050008 | A1 * | 3/2003 | Patterson | H04B 7/18578 |
| | | | | 455/12.1 |
| 2016/0338037 | A1 * | 11/2016 | Ode | H04W 8/22 |
| 2017/0105152 | A1 * | 4/2017 | Lou | H04L 5/143 |

(Continued)

OTHER PUBLICATIONS

Mazumder, Shahed, "5G New Radio-Emerging Spectrum Bands", May 2, 2017, https://blog.cartesian.com/5g-new-radio-emerging-spectrum-bands, p. 1-7 (Year: 2017).*

*Primary Examiner* — Linda Wong
(74) *Attorney, Agent, or Firm* — Michael A. Rahman

(57) ABSTRACT

A method of wireless communication includes receiving a plurality of parameter values at a user equipment (UE) using a first local oscillator (LO) frequency value, where the plurality of parameter values includes indications of a downlink frequency channel and an uplink frequency channel. The method further includes determining a second LO frequency value at the UE, where the second LO frequency value is determined using the indications of downlink and uplink frequency channels. The method further includes receiving downlink signals from an associated base station using the second LO frequency value.

9 Claims, 12 Drawing Sheets

(56) References Cited

U.S. PATENT DOCUMENTS

2017/0118750 A1* 4/2017 Kikuma ............ H04W 72/0426
2017/0214519 A1* 7/2017 Park ........................ H04L 25/02
2018/0352445 A1* 12/2018 Khan .................... H04W 16/28
2019/0110304 A1* 4/2019 Khan ................ H04W 72/1215

* cited by examiner

SIGNALING METHODS FOR COMMUNICATION SYSTEMS WITH WIDELY SPACED DOWNLINK AND UPLINK FREQUENCY CHANNELS

CROSS-REFERENCE TO RELATED APPLICATION

This application claims priority to U.S. Provisional Patent Application No. 62/574,164 filed Oct. 18, 2017 and entitled "SIGNALING METHODS FOR COMMUNICATIONS SYSTEMS WITH WIDELY SPACED DOWNLINK AND UPLINK FREQUENCY CHANNELS", which is hereby incorporated by reference in its entirety.

BACKGROUND

Aspects of the present disclosure relate generally to wireless communication systems, and more particularly to methods of signaling downlink and uplink frequency channels in a communication system relying on widely-spaced downlink and uplink frequency channels.

DESCRIPTION OF THE RELATED ART

Wireless communication networks are deployed to enable voice, video, data, messaging, and various other form of communication. The wireless networks support multiple users by sharing available network resources. Examples of wireless networks include Time Division Multiple Access (TDMA) networks, Frequency Division Multiple Access (FDMA) networks, Orthogonal FDMA (OFDMA) and Code Division Multiple Access (CDMA) networks.

A wireless communication network may include a number of base stations or access points that facilitate communication for a number of user equipments (UEs). A UE may communicate with a base station via the downlink or uplink. The uplink refers to the communication link from the UE to the base station, with signal transmission from the UE and signal reception at the base station. The downlink refers to the communication link from the base station to the UE, with signal transmission from the base station and signal reception at the UE.

Currently, wireless access is based on two popular standards: a wide area network (WAN) standard referred to as The Fourth Generation Long Term Evolution (4G LTE); and a local area network (LAN) standard called Wi-Fi. Wi-Fi is generally used indoors as a short-range wireless extension of wired broadband systems. The 4G LTE systems on the other hand provide wide area long-range connectivity both outdoors and indoors using dedicated infrastructure such as cell towers and backhaul to connect to a communication network such as the Internet.

As more people connect to the Internet, increasingly chat with friends and family, watch videos, listen to streamed music, and indulge in virtual or augmented reality, data traffic continues to grow at unprecedented rates. In order to address the continuously growing wireless capacity challenge, the next generation LAN and WAN systems are expected to rely on higher frequencies referred to as millimeter wave bands in addition to currently used frequency bands below 7 GHz. Table 1 provides examples of millimeter wave bands.

TABLE 1

Examples of millimeter wave bands

| Bands [GHz] | Frequency [GHz] | Bandwidth [GHz] |
| --- | --- | --- |
| 24 GHz Bands | 24.25-24.45 | 0.200 |
|  | 25.05-25.25 | 0.200 |
| LMDS Band | 27.5-28.35 | 0.850 |
|  | 29.1-29.25 | 0.150 |
|  | 31-31.3 | 0.300 |
| 39 GHz Band | 38.6-40 | 1.400 |
| 37/42 GHz Bands | 37.0-38.6 | 1.600 |
|  | 42.0-42.5 | 0.500 |
| 60 GHz | 57-64 | 7.000 |
|  | 64-71 | 7.000 |
| 70/80 GHz | 71-76 | 5.000 |
|  | 81-86 | 5.000 |
| 90 GHz | 92-94 | 2.900 |
|  | 94.1-95.0 |  |
| 95 GHz | 95-100 | 5.000 |
| 105 GHz | 102-105 | 7.500 |
|  | 105-109.5 |  |
| 112 GHz | 111.8-114.25 | 2.450 |
| 122 GHz | 122.25-123 | 0.750 |
| 130 GHz | 130-134 | 4.000 |
| 140 GHz | 141-148.5 | 7.500 |
| 150/160 GHz | 151.5-155.5 | 12.50 |
|  | 155.5-158.5 |  |
|  | 158.5-164 |  |

SUMMARY

Various aspects of the present disclosure are directed to methods for communication systems utilizing widely-spaced downlink and uplink frequency channels.

In one aspect of the disclosure, a method of wireless communication includes receiving a plurality of parameter values at a user equipment (UE) using a first local oscillator (LO) frequency value, where the plurality of parameter values includes indications of a downlink frequency channel and an uplink frequency channel. The method further includes determining a second LO frequency value at the UE, where the second LO frequency value is determined using the indications of downlink and uplink frequency channels. The method further includes receiving downlink signals from an associated base station using the second LO frequency value.

In an additional aspect of the disclosure, a method of wireless communication includes receiving a plurality of parameter values at a user equipment (UE), where the plurality of parameter values includes indications of an uplink frequency channel and a local oscillator (LO) frequency value. The method further includes determining a downlink frequency channel at the UE, where the downlink frequency channel is determined using the indications of the uplink frequency channel and the LO frequency value. The method further includes receiving downlink signals on the downlink frequency channel from an associated base station.

In an additional aspect of the disclosure, a method of wireless communication includes receiving a plurality of parameter values at a base station, where the plurality of parameter values includes channel properties and indications of an uplink frequency channel. The method further includes determining a downlink frequency channel using a predetermined channel mapping and the indications of an uplink frequency channel. The method further includes transmitting at least the indication of the downlink frequency channel to an associated user equipment (UE).

In an additional aspect of the disclosure, a non-transitory computer-readable medium includes program code recorded for wireless communications. The program code includes code to receive a plurality of parameter values at a user equipment (UE) using a first local oscillator (LO) frequency value, where the plurality of parameter values includes indications of a downlink frequency channel and an uplink frequency channel. The program code also includes code to determine a second LO frequency value at the UE, where the second LO frequency value is determined using the indications of downlink and uplink frequency channels. The program code also includes code to receive downlink signals from an associated base station using the second LO frequency value.

In an additional aspect of the disclosure, a method of wireless communication includes receiving a plurality of parameter values at a user equipment (UE), where the plurality of parameter values includes indications of a downlink frequency channel and an uplink frequency channel. The method also includes estimating a carrier frequency offset at the UE, and determining a sampling frequency offset at the UE, where the sampling frequency offset is determined using the estimated carrier frequency offset and the indications of a downlink frequency channel. The method also includes receiving downlink signals on the indicated downlink frequency channel using the carrier frequency offset and the sampling frequency offset. The method also includes transmitting uplink signals on the indicated uplink frequency channel.

In an additional aspect of the disclosure, a method of wireless communication includes receiving a plurality of parameter values at a user equipment (UE), where the plurality of parameter values includes indications of a frequency channel and a relationship between a carrier frequency offset and a sampling frequency offset. The method also includes estimating the carrier frequency offset at the UE and determining the sampling frequency offset at the UE, where the sampling frequency offset is determined using the estimated carrier frequency offset and the relationship between the carrier frequency offset and the sampling frequency offset. The method also includes receiving downlink signals on the indicated frequency channel using the carrier frequency offset and the sampling frequency offset.

BRIEF DESCRIPTION OF THE DRAWINGS

Reference is now made to the following descriptions taken in conjunction with the accompanying drawings, in which.

DETAILED DESCRIPTION

The detailed description set forth below, in connection with the appended drawings, is not intended to represent only configurations in which the concepts described herein may be practiced. The detailed description includes specific details for the purpose of providing a thorough understanding of the various concepts. However, it will be apparent to those skilled in the art that these concepts may be practiced without these specific details.

Figure 1:
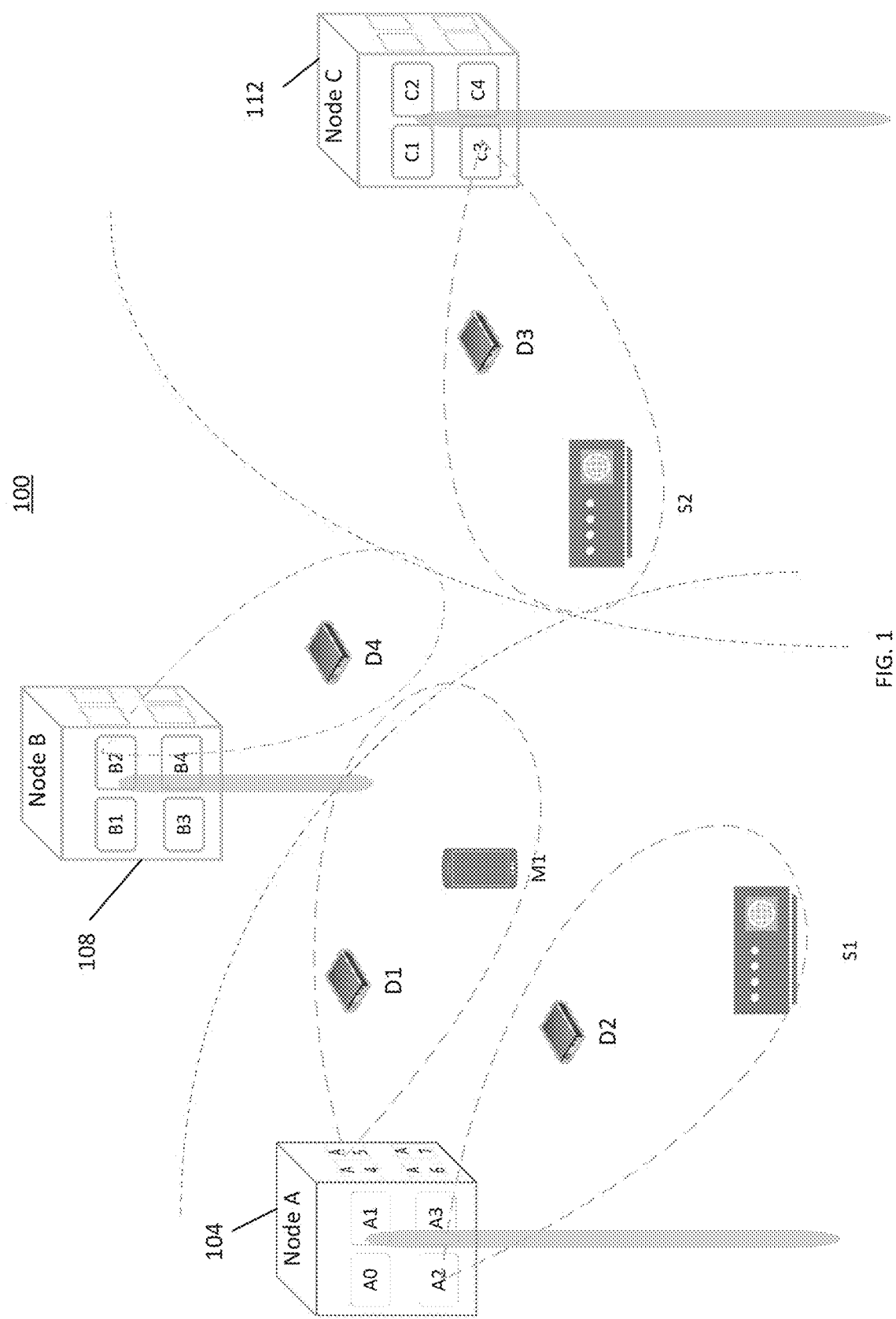
FIG. 1 illustrates a wireless communication system in accordance with disclosed embodiments.

FIG. 1 shows a wireless communication system 100 in accordance with disclosed embodiments. System 100 includes a number of nodes 104, 108 and 112 and other network entities. Each node includes a plurality of base stations or access points. As shown in FIG. 1, node 104 includes access points A0-A15, node 108 includes access points B1-B4, and node 112 includes access points C1-C4. Each access point may communicate with a plurality of user equipments (UEs), e.g., smartphones, tablets, laptop computers, desktop computers, and phablets within a coverage area. By way of example, the access points of node 104 communicate with UEs D1, D2, M1 and S1, and the access points of node 112 communicate with UEs D3 and S2.

According to disclosed embodiments, downlink (DL) and uplink (UL) transmissions are performed on widely-spaced frequency bands. While the exemplary embodiments herein utilize a sub-7 GHz band for UL and a millimeter wave band (e.g., 28 GHz) for DL, it will be apparent to those skilled in the art that the embodiments disclosed herein are applicable to other widely separated DL and UL frequency bands.

One example of a sub-7 GHz (e.g., 5 GHz) wireless communications transceiver is a commercially-available IEEE 802.11ac standard-compliant Wi-Fi system on a chip (SoC), where transmit and receive ports service 5 GHz unlicensed band. Another example of a sub-7 GHz wireless communications transceiver is a commercially-available IEEE 802.11ac standard-compliant Wi-Fi baseband combined with 5 GHz radio frequency (RF) integrated circuits, where transmit and receive ports service the sub-7 GHz unlicensed band.

Figure 2:
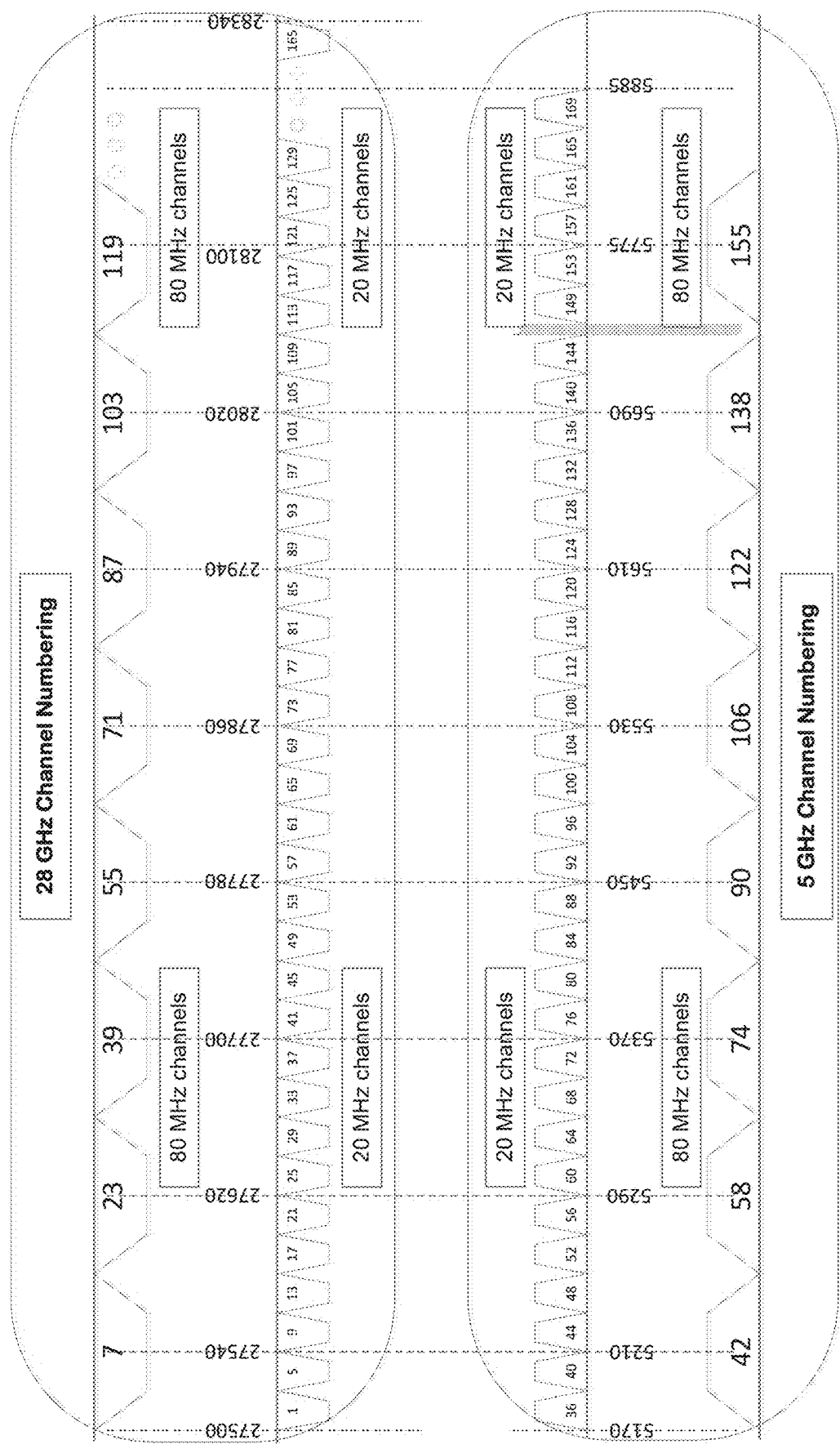
FIG. 2 illustrates an exemplary channel numbering scheme.

Referring to the lower half of FIG. 2, the channel numbering used for 20 and 80 MHz channels in accordance with the IEEE 802.11 standard is shown. The 20 MHz channel located between 5170 MHz and 5190 MHz, centered at 5180 MHz, is numbered as Channel #36. Similarly, the 80 MHz channel located between 5170 MHz and 5250 MHz, centered at 5210 MHz, is numbered Channel #42.

Referring now to the upper half of FIG. 2, an exemplary channel numbering scheme for the 28 GHz band is illustrated in accordance with disclosed embodiments. The 28 GHz band shown in FIG. 2 begins at 27.5 GHz and is 850 MHz wide. Channel numbering for the 28 GHz band starts at Channel #1 for a 20 MHz channel located between 27500 MHz and 27520 MHz, centered at 27510 MHz. A grid of 5 MHz is used. Thus, the next channel located between 27520 and 27540, centered at 27530 is numbered Channel #5. The numbering may start at some other number instead of 1, and a spacing other than 5 MHz may be chosen.

Figure 3:
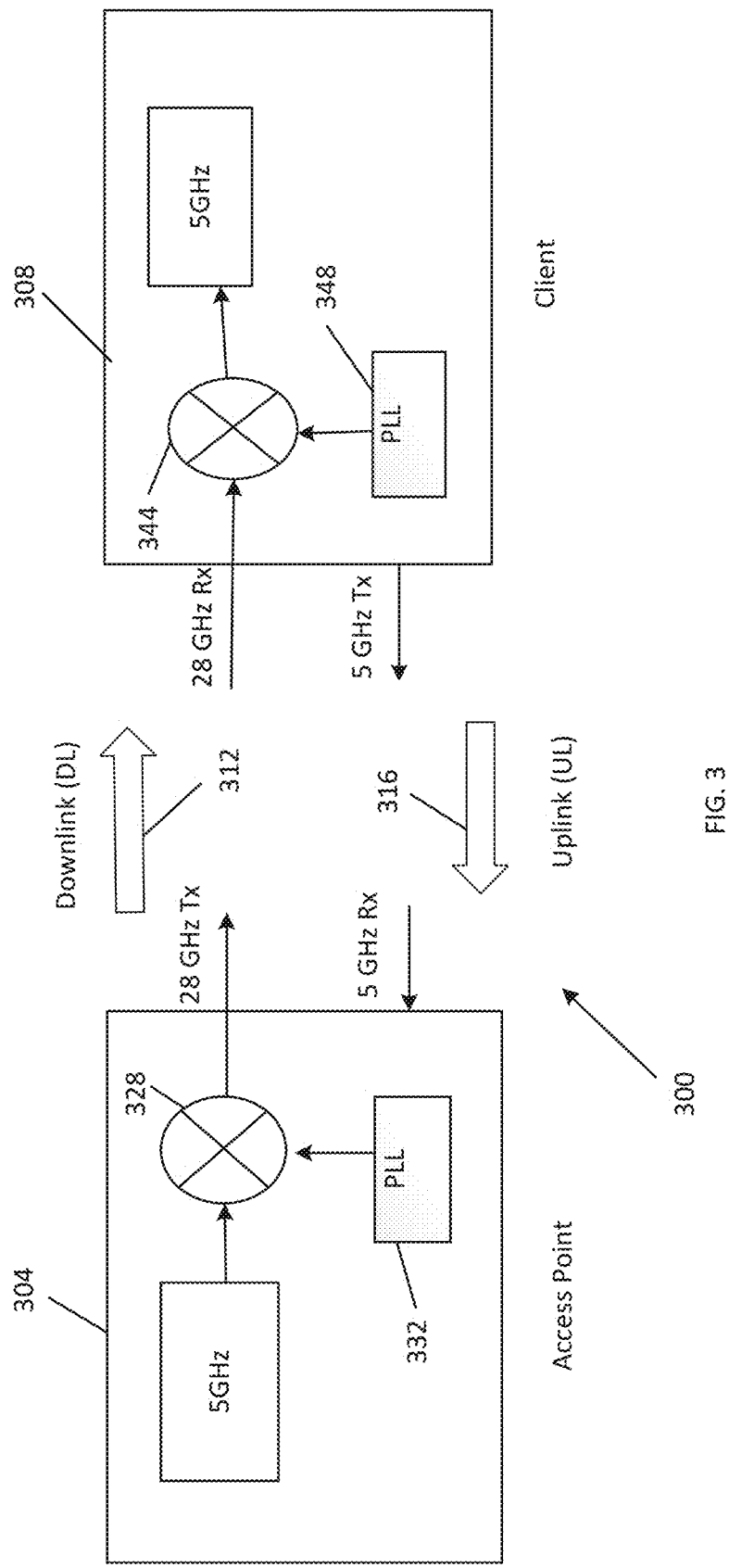
FIG. 3 shows wireless communication between an access point and a user equipment.

FIG. 3 shows wireless communication between an access point 304 and a UE 308 relying on a millimeter wave band (e.g., 28 GHz) band for downlink (DL) transmission and a sub-7 GHz band for uplink (UL) transmission in accordance with disclosed embodiments. In the access point 304, a mixer 328 upconverts a 5 GHz signal to 28 GHz by taking the analog product of a local oscillator (LO) frequency, generated through a phase-locked loop (PLL) 332 and 5 the GHz signal. The 28 GHz signal is then transmitted over the air as a DL transmission. The UE 308 receives the 28 GHz DL signal and down-converts to a 5 GHz signal using a mixer 344 with the same local oscillator frequency (LO) frequency generated using a PLL 348.

Figure 4:
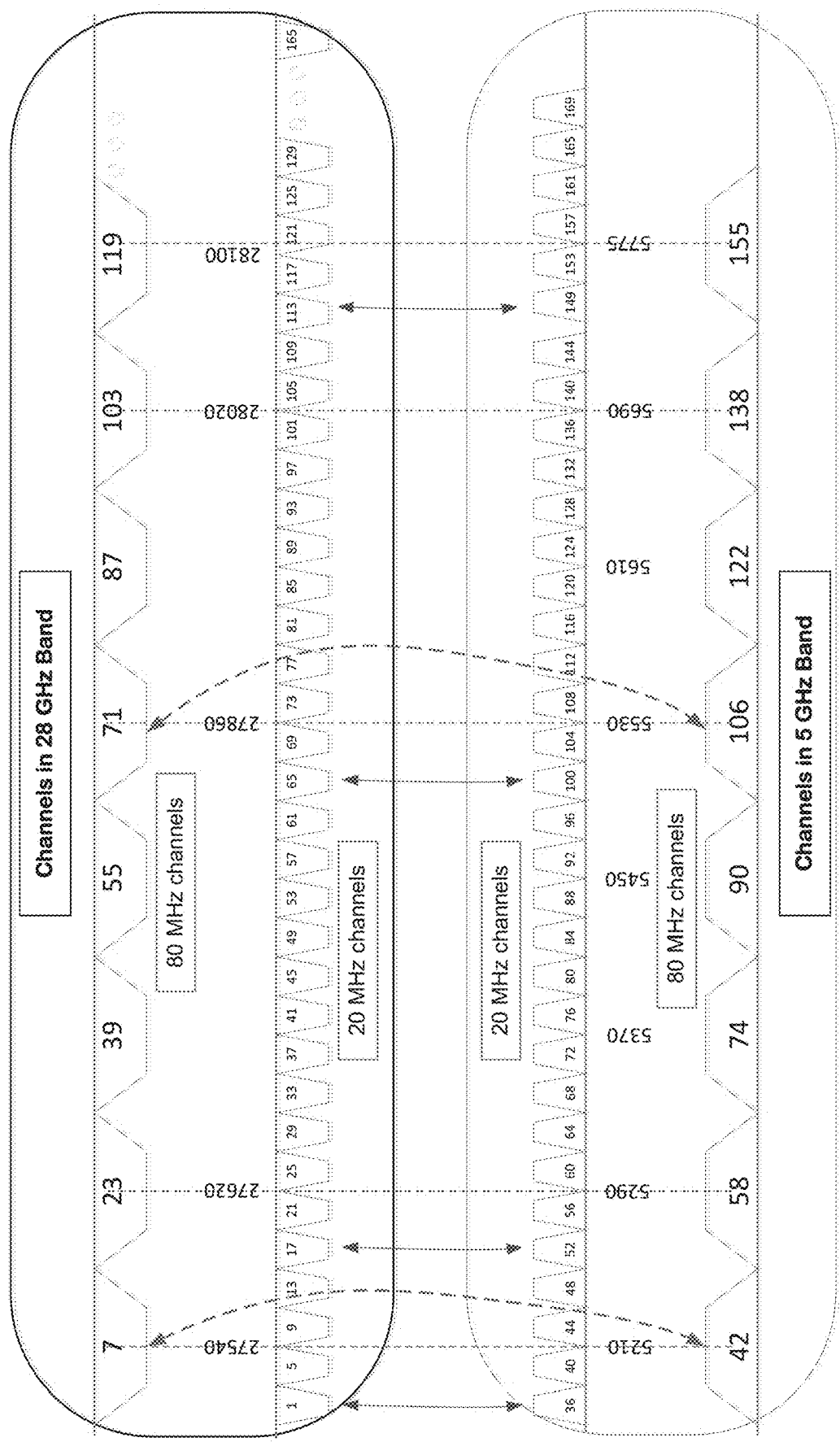
FIGS. 4-5 illustrate exemplary mapping schemes.

An exemplary mapping is illustrated in FIG. 4, where a 20 MHz channel in the 5 GHz band, channel #36 maps to channel #1 in the 28 GHz band. Thus, if AP 304 receives UL transmission on channel #36 in the 5 GHz band, AP 304 selects channel #1 in the 28 GHz band for DL transmission. Similarly, channel #52 in the 5 GHz band maps to channel #17 in the 28 GHz band, and channel #100 in the 5 GHz band maps to channel #65 in the 28 GHz band. In another exemplary mapping illustrated in the same FIG. 4, an 80 MHz channel in the 5 GHz band, channel #42 maps to channel #7 in the 28 GHz band.

According to some disclosed embodiments, a UL channel in the sub-7 GHz band can be mapped to an arbitrary DL channel in the 28 GHz band (more generally the millimeter wave bands), and vice versa, by using an appropriate LO frequency, in accordance with the relationship:

$$f_{DL}^c = f_{UL}^c + f_{LO}$$

In the foregoing example of FIG. 4, channel #36 (a 20 MHz channel) in the 5 GHz band, with a center frequency $f_{UL}^c = 5.18$ GHz is mapped using an LO frequency $f_{LO} = 22.33$ GHz, to channel #1 (a 20 MHz channel) in the 28 GHz band with center frequency $f_{LO} = 27.510$ GHz.

Figure 5:
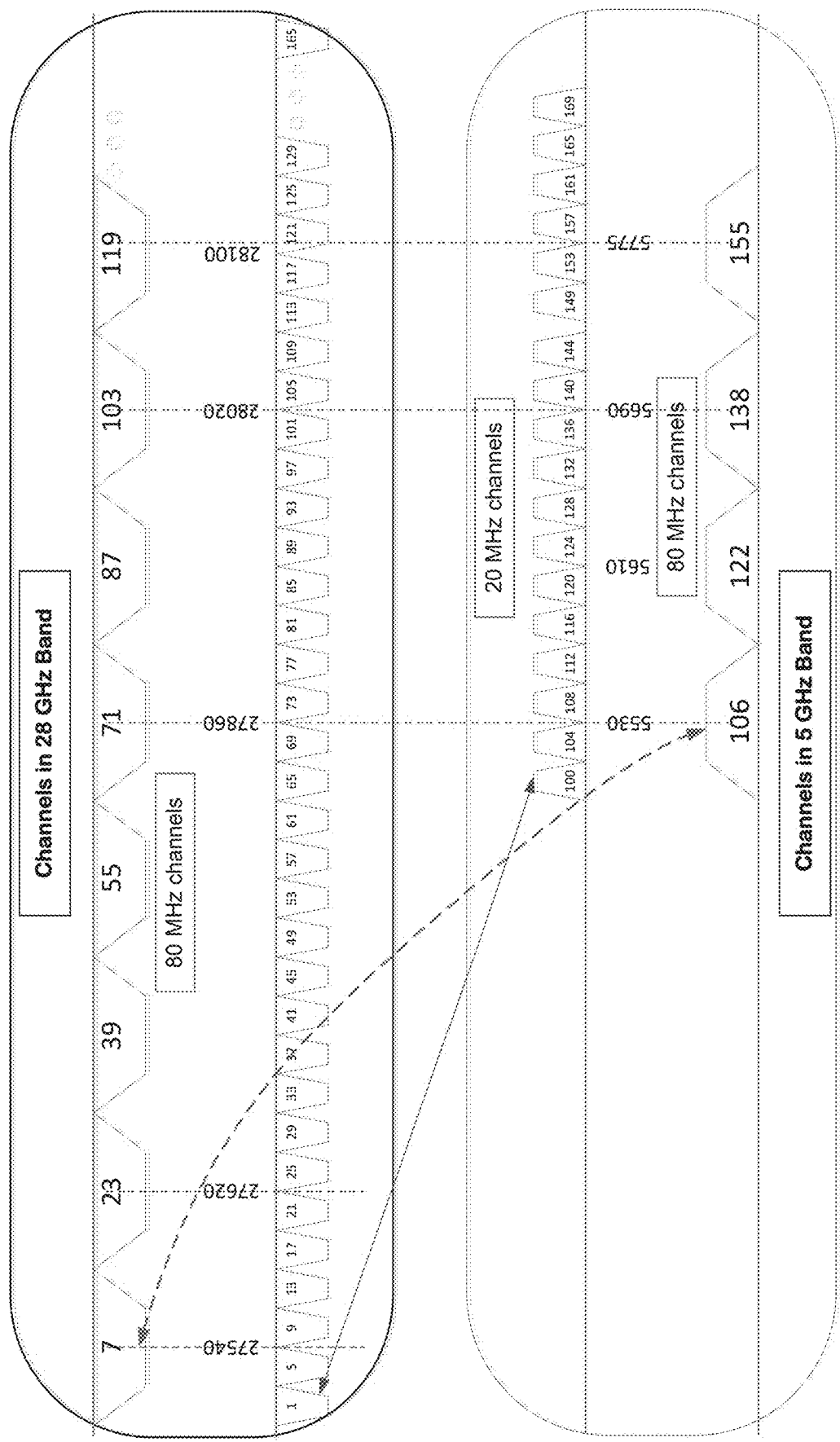

Referring now to FIG. 5, by using another LO frequency $f_{LO} = 22.01$ GHz, channel #100 in the 5 GHz band can be mapped to Channel #1 in the 28 GHz band. Such flexible mappings from a channel in the sub-7 GHz to channels in the millimeter wave bands using different LO frequencies allow optimal use of the spectrum and allow the needed flexibility to avoid, or minimize interference. For example, all operators may not have the license to use the entire 850 MHz in the 28 GHz bands. Alternatively, it is possible that certain channels in the unlicensed 5 GHz band are disallowed for use in certain regions based on the presence of other primary users.

Thus, a UE with its LO tuned to 22.01 GHz, will down convert a 28 GHz transmitted in Channel #1 down to Channel #100 in the 5 GHz band, while another UE with its LO tuned to 22.33 GHz will down convert the same signals from Channel #1 down to channel #36 in the 5 GHz band. While the DL signal may still be received, the UL signals from the UEs will not reach the AP correctly as the AP cannot be listening on two different channels in the 5 GHz band at the same time. For a system to interoperate correctly, it is necessary that the receiver of a UE listens to the same millimeter wave frequency channel that the transmitter of an AP is transmitting over, and at the same time the transmitter of the UE selects the same 5 GHz channel for transmission that the receiver of the access point is listening on.

According to disclosed embodiments, a BS or AP periodically transmits indication of the DL center frequency and the UL center frequency used on the wireless link in a signaling message. The UE receives the signaling packet over the air on the millimeter wave frequency band and down converts the received packet to sub-7 GHz band and passes the signal for baseband processing where the message is decoded. The LO frequency is computed from the DL center frequency and the UL center frequency with the relationship described hereinafter:

$$f_{LO} = f_{DL}^c - f_{UL}^c$$

In another embodiment, the AP may transmit DL and UL channel numbers that correspond to a pre-specified channel center frequency instead of the DL and UL channel center frequencies. The UE may convert the DL and UL channel numbers to channel center frequencies $f_{DL}^c$ and $f_{UL}^c$ respectively, in accordance with a specified fixed mapping for the respective DL and UL frequency spectrum bands. After converting the channel numbers to the center frequencies, the LO frequency $f_{LO}$ may be computed using the relationship described before.

In yet another embodiment, the AP may transmit a channel number (corresponding to a center frequency of the UL channel) and channel frequency information (corresponding to the center frequency of the DL channel). The channel number is converted to the corresponding channel center frequency and the relation described before can be used for computing the LO frequency $f_{LO}$.

According to disclosed embodiments, uplink and downlink frequencies are unknown to the UE prior to receiving the indications of the uplink and downlink frequencies from the base station or access point. After receiving the indications of uplink and downlink frequencies, the UE determines the appropriate LO frequency. The UE receives downlink signals using the appropriate LO frequency.

According to some disclosed embodiments, wherein the AP and the client devices communicate using the IEEE 802.11 protocol, beacon messages are transmitted periodically by the AP. The beacon messages transmitted by the AP include the sub-7 GHz channel number and DL channel information. The DL channel information, which may include DL channel center frequency or DL channel number, is transmitted using an information element (IE) as a part of the beacon message to explicitly indicate the DL channel information corresponding to the millimeter wave band channel used for communication.

Figure 6A:
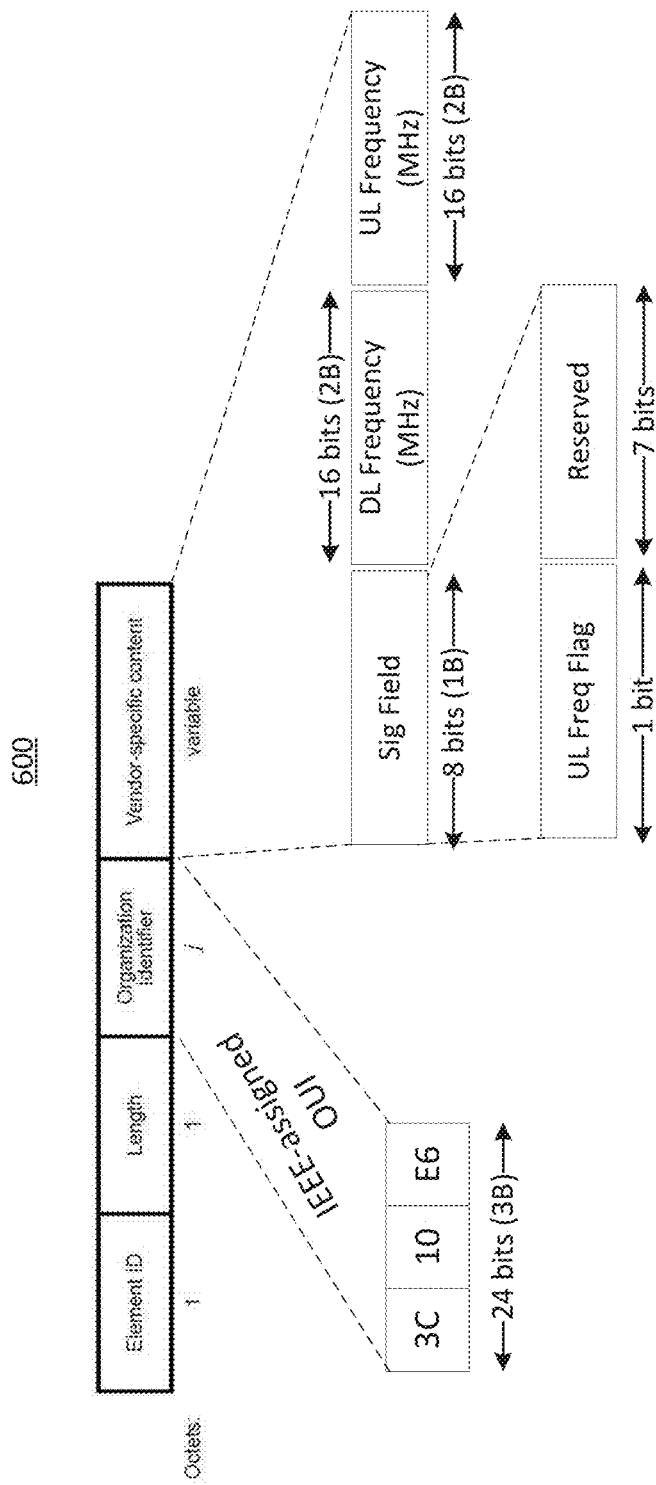
FIGS. 6A-6C are block diagrams conceptually illustrating exemplary frame structures in which resource blocks are partitioned for transmission of parameter values.

FIG. 6A is a block diagram conceptually illustrating an exemplary frame structure 600 for an information element which may be contained in, for example, a beacon message of systems communicating using IEEE 802.11 protocol. In the exemplary frame structure 600, the available resource blocks are partitioned into sections for transmissions of Element ID, Length, Organization Identifier and vendor specific content. The sections may have configurable size. A vendor specific information element (IE) is depicted and an example of an IEEE-assigned OUI (Organizationally unique identifier) is shown to indicate the vendor's ID. The IE carries a 8-bit signaling field indicated as "Sig Field", followed by a body. The body of the IE carries various information based on a bit map carried in the Sig Field. Each bit in the bitmap flags the presence of a certain parameter value. Thus, for instance, if the UL Frequency Flag is set to 1, the body will contain a 16 bit value indicating the UL frequency in MHz. If the UL Frequency Flag is set to 0, then in this example only the DL channel center frequency is present. In some embodiments, the Sig Field may be more than 8 bits or less than 8 bits, and the UL channel center frequency can be more than 16 bits or less than 16 bits. In some embodiments, instead of the UL channel center frequency, a channel number corresponding to a unique channel center frequency can be carried in the body. Also, in some embodiments, the information may not necessarily be a vendor specific IE but may be a standard IE according to a protocol or any other standard.

In another embodiment, regardless of the explicit presence of the DL and UL channel information, the UE derives the local oscillator (LO) frequency by noting whether the UL channel number in the signaling message is the same as the channel number corresponding to the UL frequency that the UE is using. If the channel number in the signaling message is the same as the channel number being used by the UE then the LO frequency chosen by the UE matches that used by the transmitting device, in this case the AP. When the channel information indicated in the signaling message is not the same as the channel number being used by the UE, the UE derives the LO frequency that the AP is using by computing the difference between the DL channel center frequency that the UE is using, and the sub-7 GHz channel center frequency corresponding to the channel number indicated in the signaling message.

In another embodiment, the AP may transmit the LO frequency value in addition to the destination DL and/or UL channel information. As a result, switching time is reduced if the AP decides to change the channel or the AP is caused to change the channel based on instructions from a radio resource management entity. Explicit transmission of LO information also reduces the switching time when scanning neighboring APs.

Figure 6B:
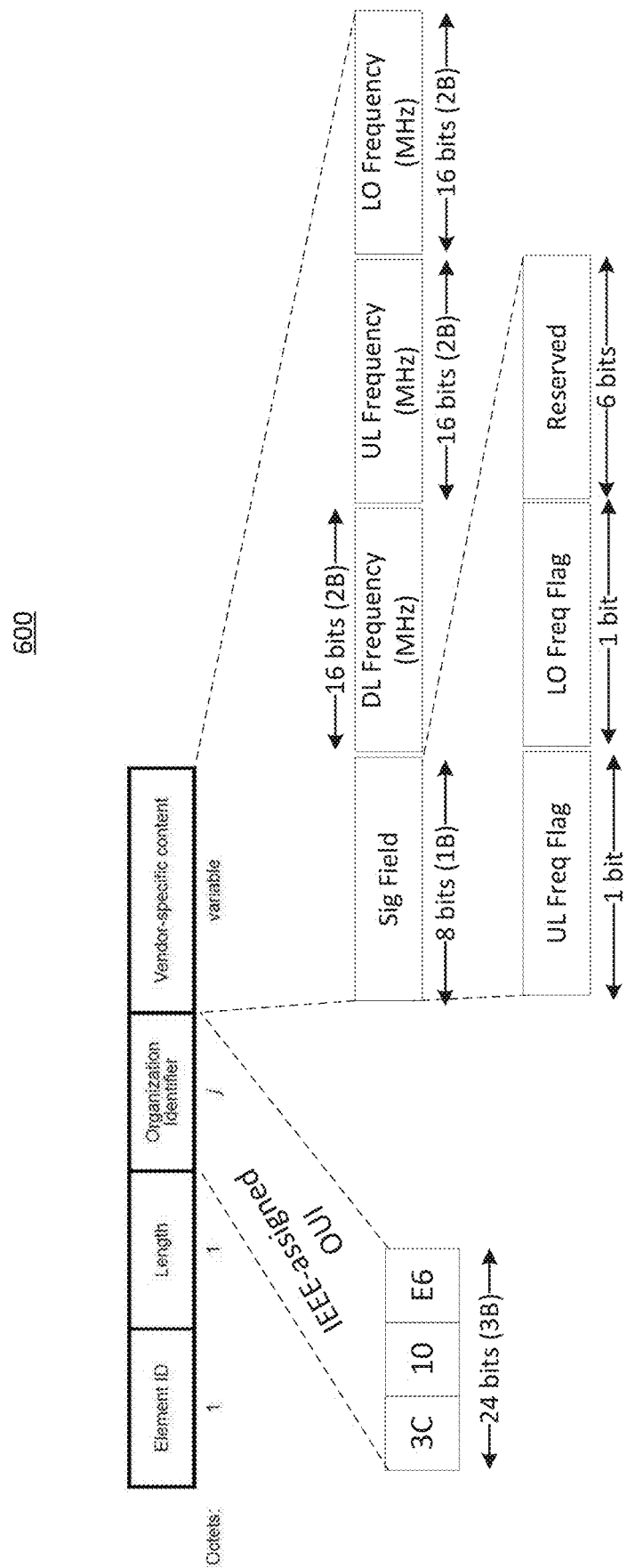

FIG. 6B is a block diagram conceptually illustrating an exemplary frame structure 610 according to disclosed embodiments. In the exemplary frame structure 610, the available resource blocks are partitioned into sections for transmissions of UL channel center frequency and the LO frequency. As discussed before, the sig field carries a bit map of which each bit flags presence of certain parameters. In the exemplary frame structure of FIG. 6B, UL frequency Flag and the LO Frequency Flag are both set to 1, and therefore both the UL center frequency and the LO frequency values (16 bits each) are present. According to some embodiments, the order of flags in the bitmap is pre-specified. In this example, the first flag (1 bit) flags the presence/absence of the UL frequency, while the second bit flags the presence/absence of the LO frequency.

According to some disclosed embodiments, an AP may transmit the channel information regarding the channels used by the neighboring APs on the same node. For example, referring to FIG. 1, A0 on node 104 may transmit information about A1 or A2 on the same node 104. In other embodiments, A0 may transmit channel information regarding the channels used by neighboring APs on neighboring nodes. For example, A0 on node 104 may transmit information about B1 on node 108 or C1 on node 112. The UE can utilize this information to scan the channels and gauge the channel conditions, traffic load etc. on the neighboring APs. If more favorable conditions exist at the neighboring APs, the UE may initiate a handover a handover to another AP resulting in an optimal use of the spectrum band.

Figure 6C:
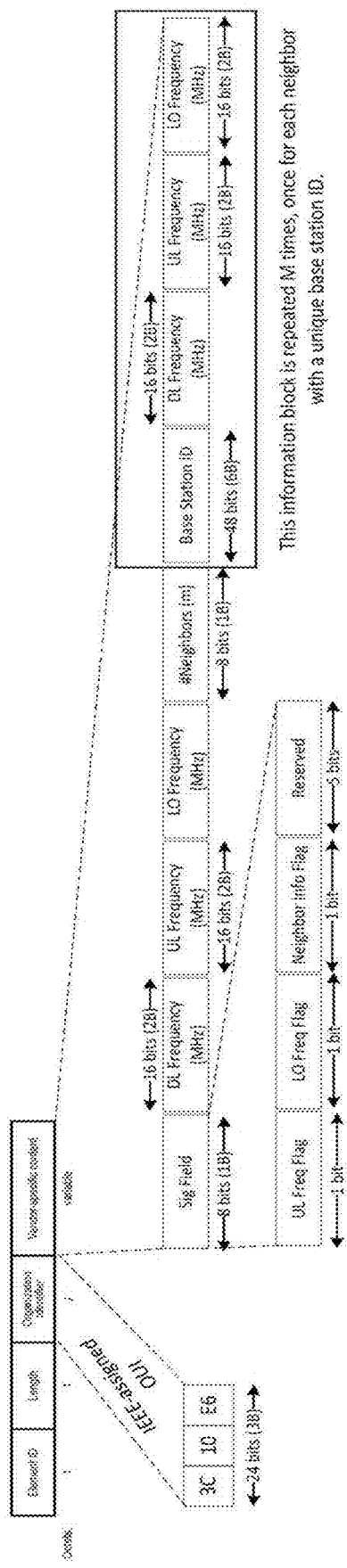

FIG. 6C is a block diagram conceptually illustrating an exemplary frame structure 620 in which the available resource blocks are partitioned for transmission of channel information about neighboring APs of the transmitting AP. The Sig field carries a bit map of which each bit flags presence of certain parameters. In this illustration, the $3^{rd}$ bit in the Sig field flags the presence/absence of neighbor information. If this flag is set to 1, a specific sequence of field is added to the IE body. The first such field is the "number of neighbors" whose information is carried in the IE body. Then for each neighbor, the AP/BS ID, the DL channel center frequency, the UL channel center frequency and the LO frequency is carried. For each neighbor, other information (not shown in FIG. 6C), such as whether or not the AP is on the same Sector of the Base Station or not, whether it is co-located on the same physical site or not, may also be carried.

Figure 7:
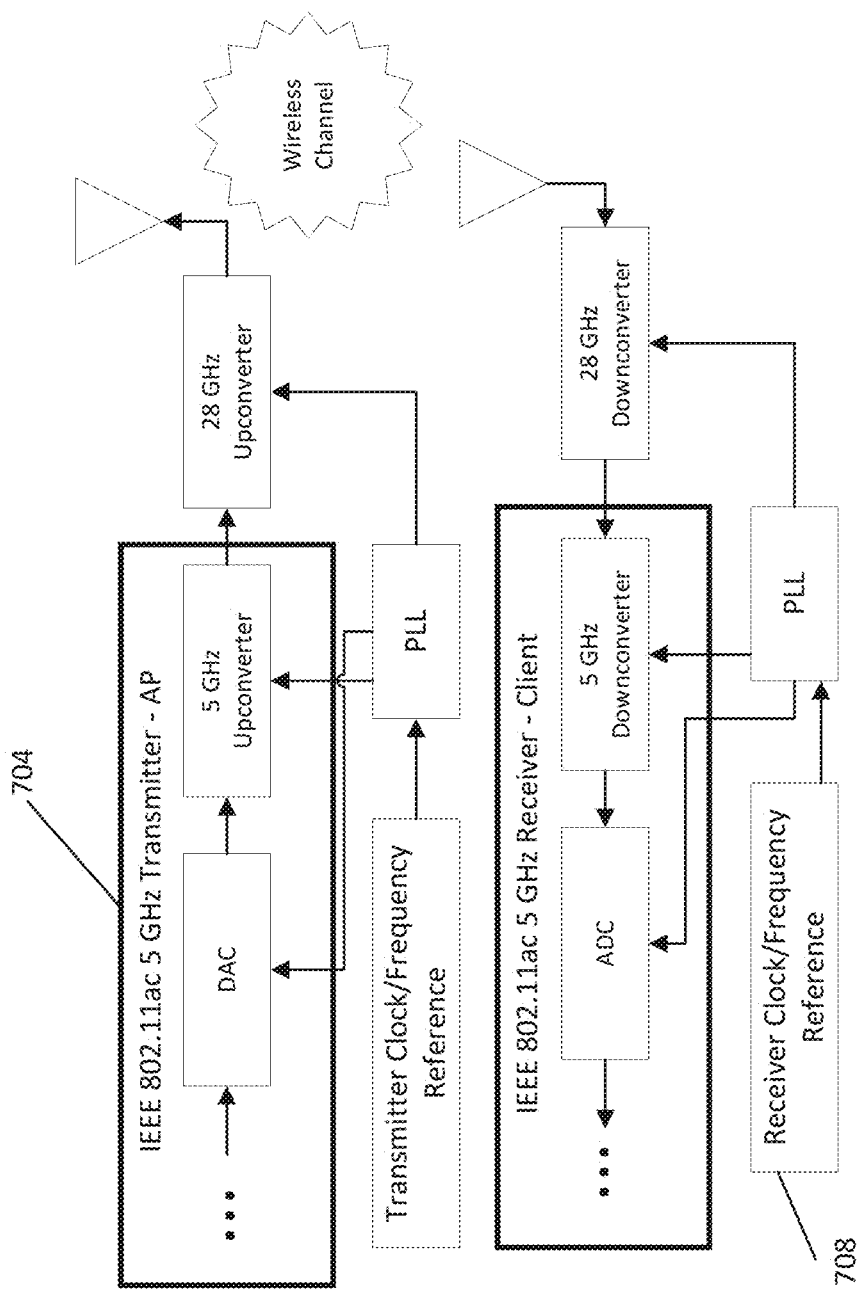
FIG. 7 is a block diagram of an access point transmitter and a user equipment receiver.

According to some disclosed embodiments, the access point (AP) may communicate a UL transmission center frequency as well as UL transmission channel numbers. The UE may use the DL channel information signaled by the AP to remove mismatches between the digital-to-analog converter (DAC) sampling frequency in the AP transmitter and the analog-to-digital converter (ADC) sampling frequency in the UE receiver. FIG. 7 is a block diagram of an AP transmitter 704 and a UE receiver 708. At the transmitter, the digital to analog converter (DAC) and the upconverters are based on the same clock reference processed through a phase locked loop (PLL) to generate local oscillator (LO) and sampling clock frequencies. Similarly, at the receiver, the analog to digital converter (ADC) and the downconverters are based on the same clock reference.

Figure 8:
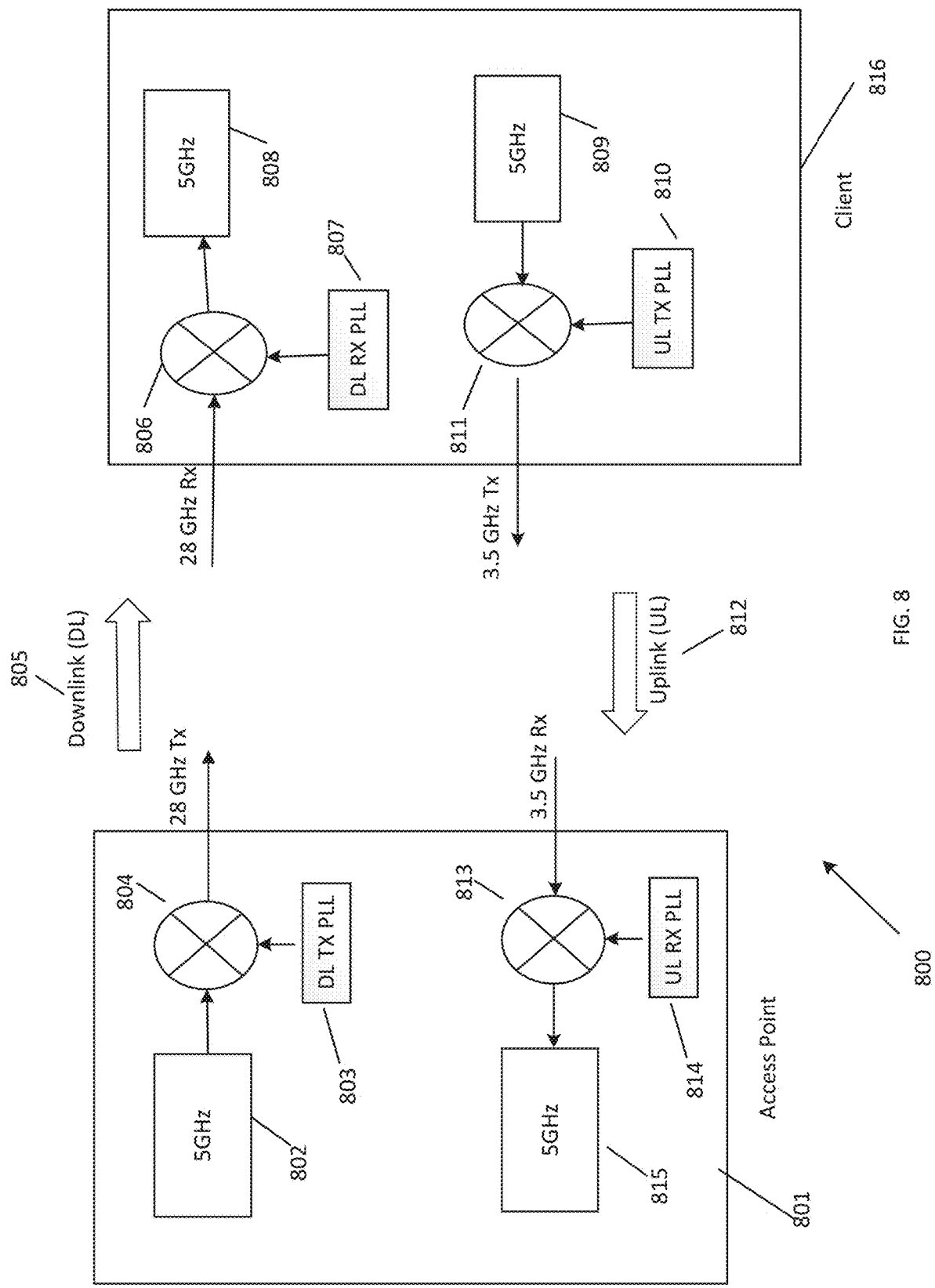
FIG. 8 illustrates wireless communication between an access point and a user equipment

FIG. 8 illustrates a system 800 which relies on 28 GHz band for DL transmission and on 3.5 GHz for UL transmission in accordance with disclosed embodiments. System 800 includes AP 801 and UE 816 that communicate wirelessly. As shown in FIG. 8, DL transmission 805 from AP 801 to UE 816 is conducted over the 28 GHz band, while UL transmission 812 from client device 816 to AP 801 is conducted over the 3.5 GHz band. In System 800, a mixer 804 is used to upconvert the 5 GHz signal 802 to 28 GHz by taking the analog product of the Local Oscillator (LO) frequency, generated through a phase-locked loop (PLL) 803, and the 5 GHz band signal. The 28 GHz signal is then transmitted over the air as a DL transmission. The UE 816 receives the 28 GHz signal and down-converts to a 5 GHz band signal using a mixer 806 with the same local oscillator frequency (LO) frequency generated using a PLL 807.

For the transmit path, a mixer 811 is used to down-convert a 5 GHz signal 809 to the 3.5 GHz band by taking the analog product of the Local Oscillator (LO) frequency, generated through a phase-locked loop (PLL) 810, and the 5 GHz band signal. The 3.5 GHz band signal is then transmitted over the air as a UL transmission 812. The AP 801 receives the 3.5 GHz band signal and up-converts to a 5 GHz band signal using a mixer 813 with the same local oscillator frequency (LO) frequency generated using a PLL 814. In other embodiments, the UL transmission frequency band may lie above the 5 GHz band.

According to disclosed embodiments, a base station or access point transmitter, in addition to transmitting the DL and UL center frequencies, also transmits the UL transmission center frequency, denoted as $f_{UL,TX}^c$, which is obtained by the UE on decoding the DL packet. The UL center frequency (e.g., 5 GHz) is the center of the channel used in, for example, a modem or SoC, while UL transmission center frequency (e.g., 3.5 GHz) is the center frequency of the channel actually used for transmission. In some embodiments, wherein the UL transmission center frequency $f_{UL,TX}^c$ is larger than the UL center frequency $f_{UL}^c$, the UE calculates the LO frequency required for UL transmissions, denoted as $f_{LO}^{UL}$, as $f_{LO}^{UL}=f_{UL,TX}^c-f_{UL}^c$. Referring to FIG. 8, the mixer 811 and the PLL 810 are configured to output a sum of the 5 GHz frequency 809 and the UL LO frequency, whereas the mixer 813 and the PLL 814 are configured to output a difference of the UL transmission frequency and the UL LO frequency.

In other embodiments, wherein the UL transmission center frequency $f_{UL,TX}^c$ is smaller than the UL center frequency $f_{UL}^c$, the UE calculates the LO frequency as $f_{LO}^{UL}=f_{UL}^c-f_{UL,TX}^c$. In such embodiments, referring to FIG. 8, the mixer 811 and PLL 810 are configured to output a difference of the 5 GHz frequency 809 and the UL LO frequency, whereas the mixer 813 and PLL 814 are configured to output a sum of the UL transmission frequency and the UL LO frequency.

According to some disclosed embodiments, in addition to the DL and UL channel numbers, the AP may transmit a UL transmission channel number. The UE converts the UL transmission channel number to a UL transmission channel center frequency $f_{UL,TX}^c$ accordance with a specified fixed mapping for the frequency spectrum band for UL transmission, which may be used to derive the UL LO frequency $f_{LO}^{UL}$.

In wireless communication systems, there is often a mismatch between transmitter and receiver clock references. This impacts the link in two ways:
  a. It creates misalignment between the upconverters and the downconverters, also known as channel frequency offset (CFO);
  b. It creates misalignment between the DAC and ADC, also known as sampling frequency offset (SFO).

Modern wireless communications receivers, including those that implement the IEEE 802.11ac standard, must remove CFO and SFO to optimize performance. For example, both CFO and SFO can be removed digitally through numerically controlled oscillators (NCOs) and phase slope adjustments, respectively. To remove CFO and SFO, numerical estimates of both quantities must be available to the receiver. CFO is often measured through self-correlation of periodic digital sequences at the receiver. SFO may be mapped from CFO if the DL center frequency is known. For example, let $f_{tx}$ be the frequency of the clock reference at the transmitter. The DAC sampling clock has frequency $f_{dac}$ and is derived by applying a conversion factor K through the PLL such that $f_{dac}=K*f_{tx}$. The 5 GHz upconversion LO has frequency $f_{uc,5}$ and is derived by applying a conversion factor L such that $f_{uc,5}=L*f_{tx}$. The 28 GHz upconversion LO has frequency $f_{uc,28}$ and is derived by applying a conversion factor M such that $f_{uc,28}=M*f_{tx}$. At the receiver, the same conversion factors apply such that $f_{adc}=K*f_{rx}$, $f_{dc,5}=L*f_{rx}$, and $f_{dc,28}=M*f_{rx}$ are ADC sampling clock frequency, the 5 GHz downconversion LO frequency, and the 28 GHz down-conversion LO frequency, respectively. Together, this means that the CFO of the link equals $(L+M)*(f_{rx}-f_{tx})$ and the SFO of the link equals $K*(f_{rx}-f_{tx})$. Consequently, we can relate CFO to SFO through the relationship $SFO=K*CFO/(L+M)$. After we measure the CFO it is possible to calculate SFO, assuming we know the 28 GHz conversion factor, which is implicit in the 28 GHz downlink center frequency.

Figure 9:
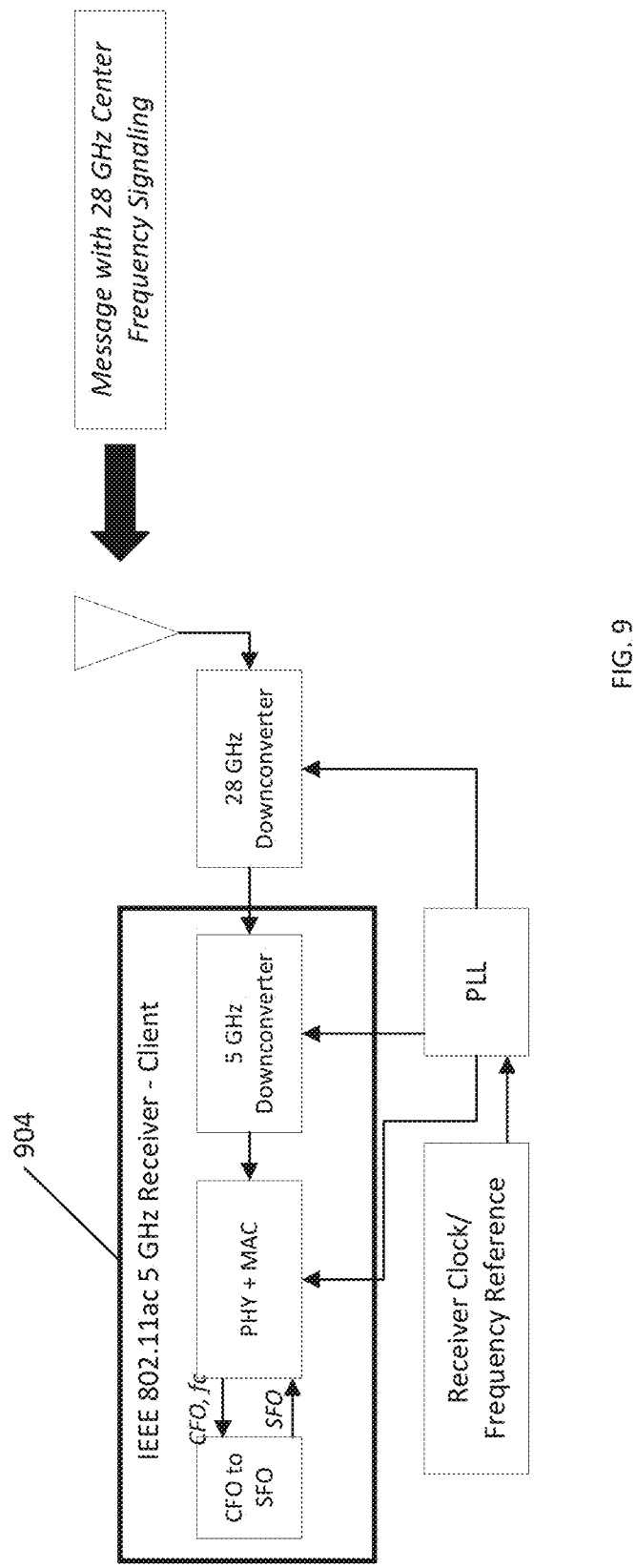
FIG. 9 is a block diagram of a receiver configured to determine CFO and SFO.

According to some disclosed embodiments, the signaling of the DL center frequency is used to inform the CFO to SFO mapping as shown in FIG. 9. A receiver 904 processes the message through the medium access control and physical layer (MAC+PHY) and extracts the downlink center frequency. The receiver 904 also estimates the CFO. Both the CFO and the downlink center frequency are used to generate and estimate of SFO, which is also provided to the PHY for future processed messages to cancel SFO degradations.

Figure 10:
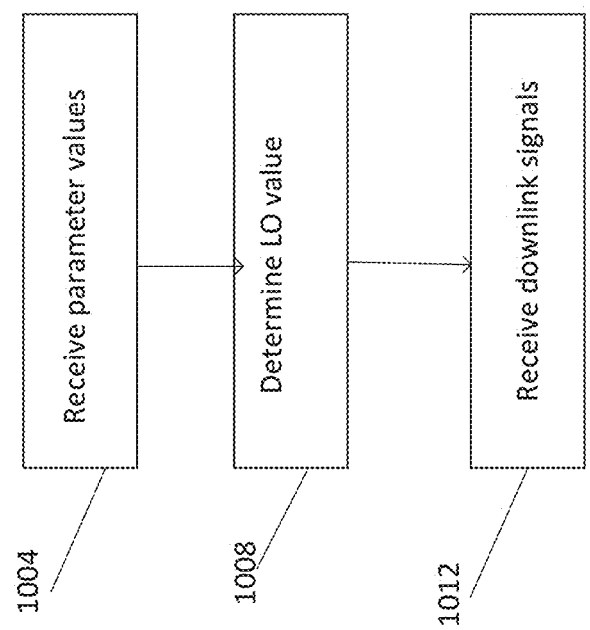
FIG. 10 is a flow diagram of a method according to disclosed embodiments.

FIG. 10 is a flow diagram illustrating example blocks executed to implement one aspect of the present disclosure. In block 1004, a plurality of parameter values is received at a user equipment (UE) using a first local oscillator (LO) value, where the plurality of parameter values includes indications of downlink frequency channel and uplink frequency channel. (e.g., channel number or frequency in MHz). In block 1008, a second LO frequency value is determined at the UE, where the second LO frequency value is determined using the indications of downlink and uplink frequency channels. In block 1012, downlink signals are received from an associated base station using the second LO frequency value.

Those skilled in the art will recognize that, for simplicity and clarity, the full structure and operation of all systems suitable for use with the present disclosure is not being depicted or described herein. Instead, only so much of a system as is unique to the present disclosure or necessary for an understanding of the present disclosure is depicted and described. The remainder of the construction and operation of the disclosed systems may conform to any of the various current implementations and practices known in the art.

Of course, those of skill in the art will recognize that, unless specifically indicated or required by the sequence of operations, certain steps in the processes described above may be omitted, performed concurrently or sequentially, or performed in a different order. Further, no component, element, or process should be considered essential to any specific claimed embodiment, and each of the components, elements, or processes can be combined in still other embodiments.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

The invention claimed is:

1. A method of wireless communication, comprising:
    receiving a plurality of parameter values at a user equipment (UE) using a first local oscillator (LO) frequency value, wherein the plurality of parameter values includes indications of a downlink frequency channel and an uplink frequency channel;
    determining a second LO frequency value at the UE, wherein the second LO frequency value is determined using the indications of downlink and uplink frequency channels; and
    receiving downlink signals from an associated base station using the second LO frequency value,
    wherein the downlink frequency channel is in a millimeter wave band and the uplink frequency channel is in a sub-7GHz band, wherein there is at least a 10 GHz separation between the downlink frequency channel and the uplink frequency channel, and wherein the UE receives the downlink signals in the millimeter wave band and the UE transmits uplink signals in sub-7GHz band.

2. The method of claim 1, further comprising transmitting uplink signals to the associated base station using the uplink frequency channel.

3. The method of claim 1, wherein at least one of the uplink and downlink frequency channels and the LO frequency value are unknown to the UE prior to receiving the indications.

4. The method of claim 1, wherein the first and second LO frequency values are same.

5. The method of claim 1, wherein the uplink and downlink channels are selected based on optimum utilization of a spectrum.

6. The method of claim 1, wherein the plurality of parameter values includes channel properties relating to the associated base station.

7. The method of claim 1, wherein the plurality of parameter values includes channel properties relating to neighboring base stations.

8. A non-transitory computer-readable medium having program code recorded thereon, the program code comprising:
program code to receive a plurality of parameter values at a user equipment (UE) using a first local oscillator (LO) frequency value, wherein the plurality of parameter values includes indications of downlink frequency channel and uplink frequency channel;
program code to determine a second LO frequency value at the UE, wherein the second LO frequency value is determined using the indications of downlink and uplink frequency channels; and
program code to receive downlink signals from an associated base station using the second LO frequency value,
wherein the downlink frequency channel is in a millimeter wave band and the uplink frequency channel is in a sub-7 GHz band, wherein there is at least a 10 GHz separation between the downlink frequency channel and the uplink frequency channel, and wherein the UE receives the downlink signals in the millimeter wave band and the UE transmits uplink signals in sub-7 GHz band.

9. The non-transitory computer-readable medium of claim 8, wherein the program code further includes program code to transmit uplink signals to the associated base station.

* * * * *